(12) United States Patent
Huang

(10) Patent No.: US 9,961,784 B2
(45) Date of Patent: May 1, 2018

(54) MANUFACTURING METHOD OF CIRCUIT SUBSTRATE

(71) Applicant: Subtron Technology Co., Ltd., Hsinchu County (TW)

(72) Inventor: Tzu-Wei Huang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days. days.

(21) Appl. No.: 15/475,134

(22) Filed: Mar. 31, 2017

(65) Prior Publication Data

US 2017/0208696 A1 Jul. 20, 2017

Related U.S. Application Data

(62) Division of application No. 13/551,586, filed on Jul. 17, 2012, now Pat. No. 9,655,254, which is a division
(Continued)

(30) Foreign Application Priority Data

Apr. 20, 2010 (TW) ................................ 99112313 A

(51) Int. Cl.
*H05K 3/46* (2006.01)
*H05K 3/42* (2006.01)
(Continued)

(52) U.S. Cl.
CPC ............ *H05K 3/4682* (2013.01); *B23K 11/11* (2013.01); *B32B 37/0084* (2013.01); *B32B 37/02* (2013.01); *B32B 37/04* (2013.01); *B32B 38/04* (2013.01); *B32B 38/10* (2013.01); *H05K 1/115* (2013.01); *H05K 3/0097* (2013.01); *H05K 3/02* (2013.01); *H05K 3/421* (2013.01); *H05K 3/4652* (2013.01); *B23K 2201/42* (2013.01); *B32B 2307/202* (2013.01); *B32B 2307/206* (2013.01);
(Continued)

(58) Field of Classification Search
CPC .... H05K 3/007; H05K 3/0097; H05K 3/4652; H05K 3/4682; H05K 2203/1572; Y10T 29/49165; Y10T 29/49156; Y10T 29/49126; Y10T 29/49155
See application file for complete search history.

(56) References Cited

U.S. PATENT DOCUMENTS

2003/0080409 A1\* 5/2003 Nakamura ........ H01L 23/49822
257/700
2004/0074088 A1\* 4/2004 Nakamura .......... H01L 21/4857
29/831
2009/0242261 A1\* 10/2009 Takenaka ............. H05K 1/0271
174/262

\* cited by examiner

Primary Examiner — Livius R Cazan
(74) Attorney, Agent, or Firm — JCIPRNET

(57) ABSTRACT

A manufacturing method of a circuit substrate includes the following steps. The peripheries of two metal layers are bonded to form a sealed area. Two insulating layers are formed on the two metal layers. Two including upper and bottom conductive layers are formed on the two insulating layers. Then, the two insulating layers and the two conductive layers are laminated so that the two metal layers bonded to each other are embedded between the two insulating layers. A part of the two insulating layers and a part of the two conductive layers are removed to form a plurality of blind holes exposing the two metal layers. A conductive material is formed in the blind holes and on the remained two conductive layers. The sealed area of the two metal layers is separated to form two separated circuit substrates.

4 Claims, 8 Drawing Sheets

Related U.S. Application Data of application No. 12/818,398, filed on Jun. 18, 2010, now abandoned.

(51) Int. Cl.
    *H05K 3/00*         (2006.01)
    *H05K 3/02*         (2006.01)
    *H05K 1/11*         (2006.01)
    *B23K 11/11*       (2006.01)
    *B32B 37/02*       (2006.01)
    *B32B 37/04*       (2006.01)
    *B32B 38/10*       (2006.01)
    *B32B 38/04*       (2006.01)
    *B32B 37/00*       (2006.01)
    *B23K 101/42*     (2006.01)

(52) U.S. Cl.
    CPC ....... *B32B 2311/12* (2013.01); *B32B 2457/08* (2013.01); *H05K 3/423* (2013.01); *H05K 2201/09509* (2013.01); *H05K 2201/09563* (2013.01); *H05K 2203/1572* (2013.01); *Y10T 29/49126* (2015.01); *Y10T 29/49155* (2015.01); *Y10T 29/49156* (2015.01); *Y10T 29/49165* (2015.01)

MANUFACTURING METHOD OF CIRCUIT SUBSTRATE

CROSS-REFERENCE TO RELATED APPLICATION

This application is a Divisional of and claims the priority benefit of U.S. patent application Ser. No. 13/551,586, filed on Jul. 17, 2012, now U.S. Pat. No. 9,655,254, which is a Divisional of and claims the priority benefit of U.S. patent application Ser. No. 12/818,398, filed on Jun. 18, 2010, now abandoned, which claims the priority benefits of Taiwan application Serial No. 99112313, filed on Apr. 20, 2010. The entirety of each of the above-mentioned patent applications is hereby incorporated by reference herein and made a part of specification.

BACKGROUND OF THE INVENTION

Field of the Invention

The invention relates to a method for manufacturing a circuit substrate, and more particularly, to a method for manufacturing a separable circuit substrate.

Description of Related Art

Generally, the circuit structures of a multi-layer circuit substrate are formed by the method such as a laminated process or a build up process, and thus the multi-layer circuit substrate has high circuit layout density and reduced line pitches. In the laminated process, a plurality of circuit layers is respectively formed on a plurality of insulating layers, and then the formed circuit substrate and the glass fiber resin film using for bonding two objects are aligned and laminated to form a multi layer circuit substrate.

When the multi-layer circuit substrate is formed by the laminated process, only even circuit layers can be formed, such as four layers, six layers, or more than six layers. If the multi-layer circuit substrate is formed by the build up process, the circuit structures having odd or even circuit layers can be formed based on the requirement. However, the build up process is unfavorable in mass production owing to the requirements of high position accuracy and long time consumption so that the cost is increased. If the circuit substrate is formed by performing the laminated process in a single side, the single-sided circuit layer and the single-sided insulating layer are easily warped after the laminated process so that the reliability thereof is reduced. Accordingly, the aspect of the invention lies in how to shorten the time consumption of the manufacture of the multi-layer circuit substrate and enhance the reliability of the circuit substrate.

SUMMARY OF THE INVENTION

The invention provides a method for manufacturing a circuit structure to shorten the time consumption of the manufacturing method.

The invention provides a circuit substrate having high reliability.

The invention provides a method for manufacturing a circuit substrate including the following process. Peripheries of two metal layers are bonded to form a sealed area. Two insulating layers including an upper insulating layer and a bottom insulating layer are formed on the two metal layers. Two conductive layers are formed on the two insulating layers. The two insulating layers and the two conductive layers are laminated and the two metal layers bonded with each other are embedded between the two insulating layers. A part of the two insulating layers and a part of the two conductive layers are removed to form a plurality of blind holes exposing the two metal layers. A conductive material is formed in the blind holes and on remained portions of the two conductive layers. The sealed area of the two metal layers is separated to form two separated circuit substrates.

The invention provides a method for manufacturing a circuit substrate including the following steps. Peripheries of two metal layers are bonded to form a sealed area. Two insulating layers are formed on the two metal layers and two inner conductive layers are formed on the two insulating layers. The insulating layers and the inner conductive layers are laminated and the two metal layers bonded with each other are embedded in the insulating layers. The inner conductive layers are patterned and then two outer insulating layers and two outer conductive layers are respectively disposed on the inner conductive layers. The outer insulating layers, the outer conductive layers are laminated and the inner conductive layers are embedded in the outer insulating layers. The sealed area of the two metal layers is separated to form two separated circuit substrates.

The invention provides a circuit substrate including a metal layer, an outer conductive layer, an inner conductive layer, and two insulating layers. The inner conductive layer is located between the metal layer and the outer conductive layer. The two insulating layers are respectively located between the metal layer and the inner conductive layer and between the outer conductive layer and the inner conductive layer.

According to an embodiment of the invention, the method for bonding the peripheries of the two metal layers includes an electric welding process.

According to an embodiment of the invention, after bonding the peripheries of the two metal layers, the method further includes forming at least a through hole passing through the sealed area and the two insulating layers further fill in the through hole when the two insulating layers are laminated.

According to an embodiment of the invention, the method for forming the conductive material includes an electroplating process.

According to an embodiment of the invention, after separating the sealed area of the two metal layers, the method further includes patterning the conductive material and the two conductive layers.

According to am embodiment of the invention, the circuit substrate further includes a conductive material located in a plurality of blind holes passing through the insulating layers and the conductive material is electrically connected between the metal layer and the inner conductive layer, and between the outer conductive layer and the inner conductive layer.

In view of the above, the peripheries of two metal layers are firstly bonded to form a sealed area in the invention. The two metal layers are separated until the double-sided insulating layers and the double sided conductive layer are laminated. Accordingly, the problem of warped circuit substrate is not easily generated after the laminating process of the double-sided insulating layers and the double-sided conductive layer so that the reliability of the circuit substrate is enhanced and the time consumption of manufacturing the circuit substrate is effectively reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 1A to FIG. 1H are cross-sectional views showing the method for manufacturing a circuit substrate according to an embodiment of the invention. FIG. 2A to FIG. 2I are cross-sectional views showing the method for manufacturing a circuit substrate according to another embodiment of the invention.

Figure 1A:
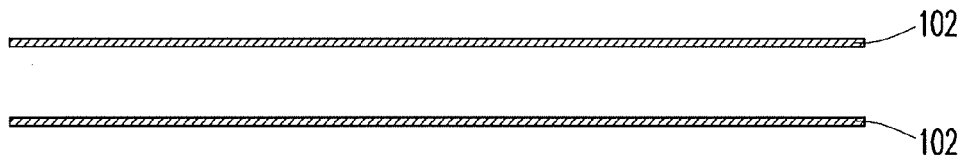
FIG. 1A to FIG. 1H are cross-sectional views showing the method for manufacturing a circuit substrate according to an embodiment of the invention.
Figure 1B:
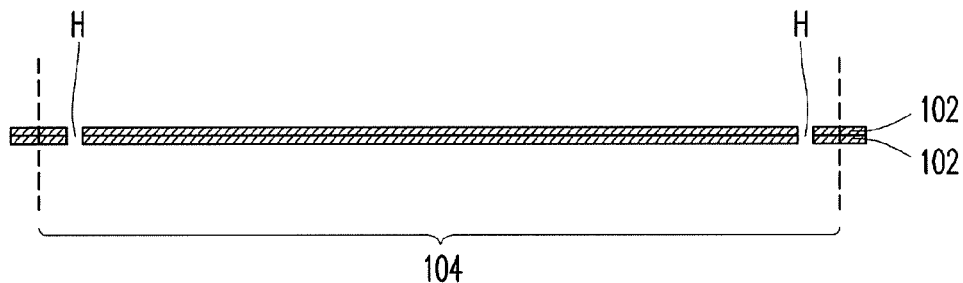
Figure 1C:
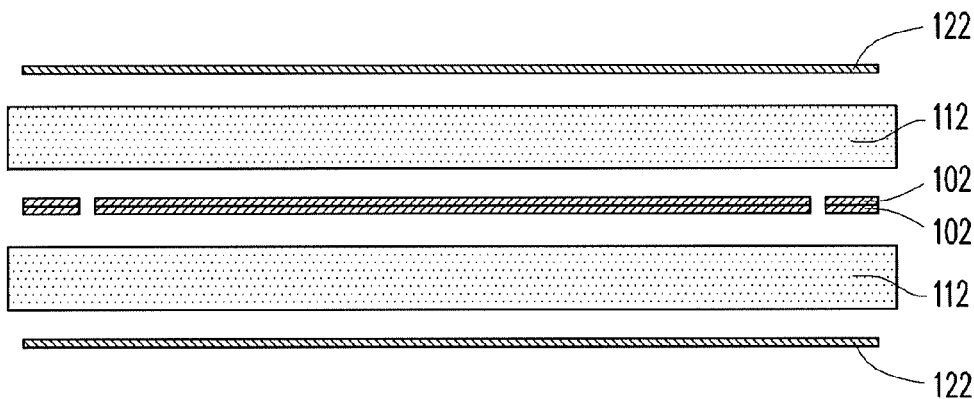
Figure 1D:
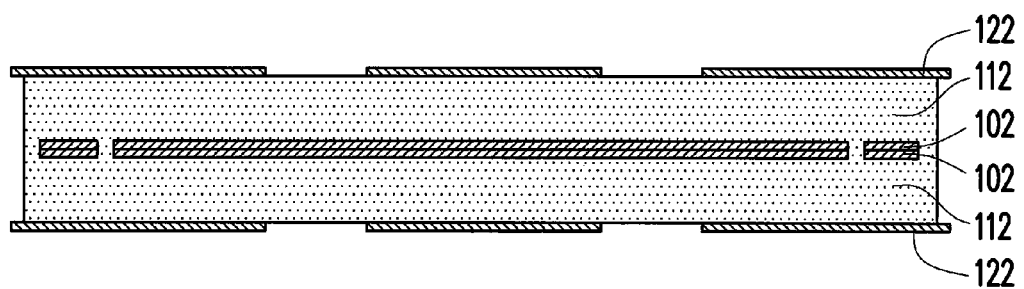

Referring to FIG. 1A and FIG. 1B, two metal layers 102, such as copper foils or other metal foils, are provided and peripheries of the two metal layers 102 are bonded to form a sealed area 104. The method for bonding the peripheries of the two metal layers 102 includes an electric welding process or a spot welding process so that the two metal layers 102 are temporally bonded together to prevent the solutions used in the subsequent process from permeating the space between the two metal layers 102. Certainly, in addition to the electric welding process or the spot welding process, an adhesion or other gel can be used to temporally bond the peripheries of the two metal layers 102 together. In the present embodiment, after bonding the peripheries of the two metal layers 102, at least a through hole H passing through the sealed area 104 can further be formed. The method for forming the through hole H includes a laser ablating process or a mechanical drilling process. Herein, the diameter of the through hole H is smaller than the area of the sealed area 104 so that the sealed quality of the sealed area 104 is not degraded by the through hole H. Next, referring to FIG. 1C and 1D, two insulating layers 112 are formed on the metal layers 102, two conductive layers 122 are formed on the two insulating layers 112, and the two insulating layers 112 and the two conductive layers 122 are laminated so that the two metal layers 102 bonded with each other are embedded between the two insulating layers 112. Simultaneously, the two insulating layers 112 further fill in the through hole H of the sealed area 104 when the two insulating layers 112 are laminated. The sizes of the two insulating layers 112 are larger than the sizes of the two metal layers 102 so that the two metal layers 102 are completely encapsulated in the two insulating layers 112 to prevent from the contamination of the ambient impurities or the solutions.

Figure 1E:
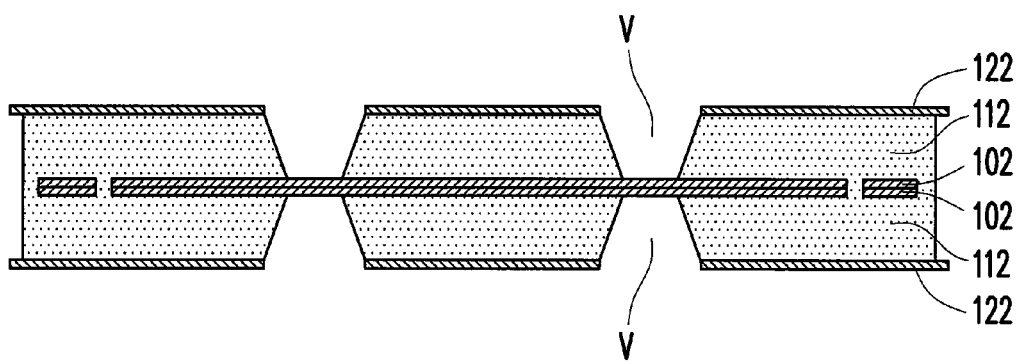
Figure 1F:
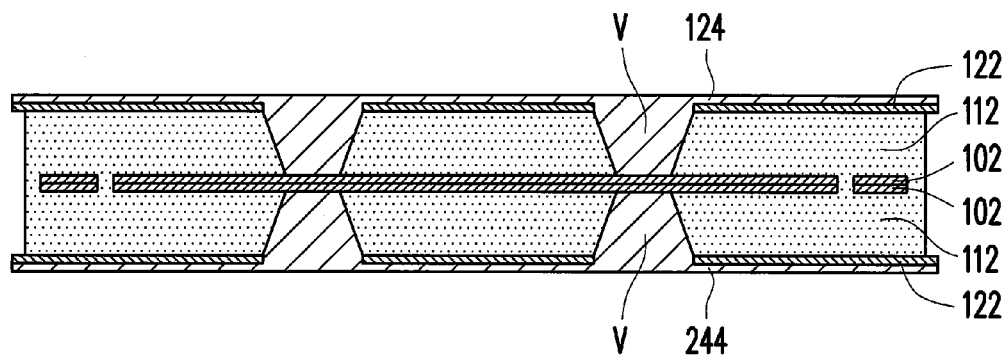
Figure 1G:
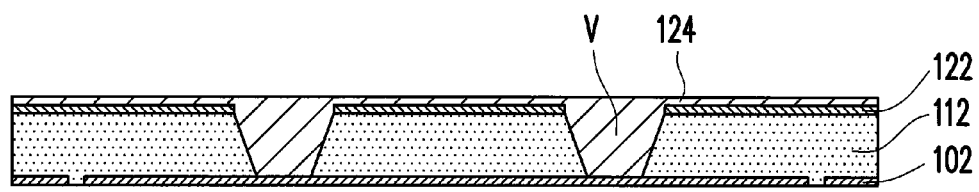
Figure 1G:
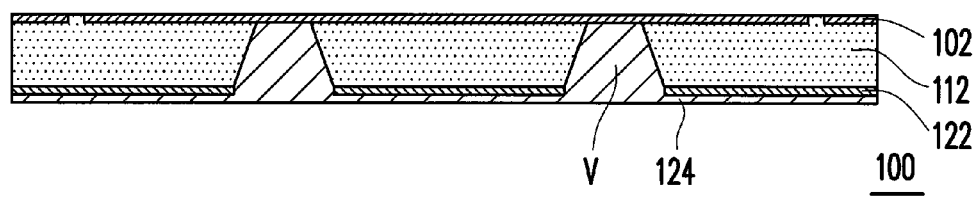
Figure 1H:
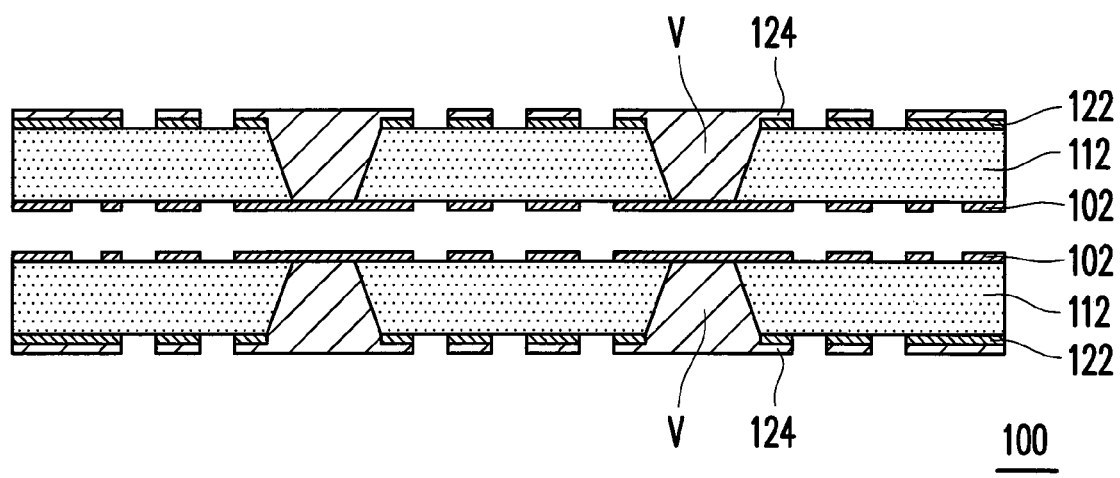

Then, referring to FIG. 1E and FIG. 1F, a part of the two insulating layers 112 and a part of the two conductive layers 122 are removed to form a plurality of blind holes V exposing the two metal layers 102. The method for forming the blind holes V includes a laser ablating process and the method for removing a part of the conductive layers 122 includes a laser ablating process, a photolithographic etching process, or the like. Thereafter, a conductive material 124 is formed in the blind holes V and on remained portions of the two conductive layers 122, wherein the remained portion means a portion of the two conductive layers 122 which is not removed. The method for forming the conductive material 124 includes an electroplating process and the conductive material 124 can be exemplified as copper or other metal. Next, referring to FIG. 1G, the sealed area 104 of the two metal layers 102 is separated to form two separated circuit substrates 100. In the present embodiment, a separator machine or other tools can be used for removing a region of the sealed area 104 encapsulating the two metal layers 102 by taking the through hole H as a reference so that the two metal layers 102 are completely separated. Certainly, the method for separating the two metal layers 102 is not restricted in the aforesaid process. Then, referring to FIG. 1H, the conductive material 124 and the two conductive layers 122 are patterned to form the required circuit layout of each circuit substrate 100.

The abovementioned embodiment provides the circuit substrates 100 having two circuit layers. In other embodiments, the circuit substrates 100 having two circuit layers can be served as a core to form a circuit substrate having four, six, or more than six circuit layers, wherein the manufacturing method thereof can be referred to the conventional process and is not described and reiterated herein. Furthermore, for manufacturing a circuit layout having odd circuit layers, the invention further provides another method for manufacturing a circuit substrate.

Figure 2A:
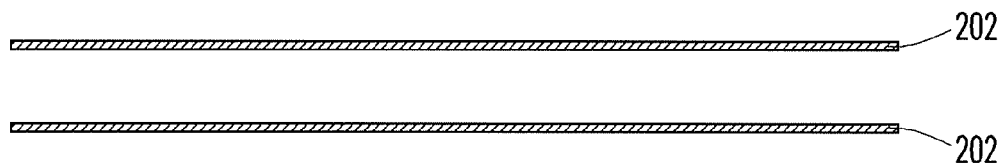
FIG. 2A to FIG. 2I are cross-sectional views showing the method for manufacturing a circuit substrate according to another embodiment of the invention.
Figure 2B:
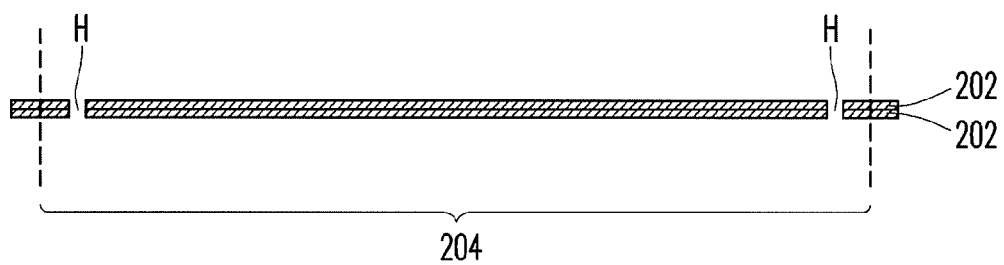
Figure 2C:
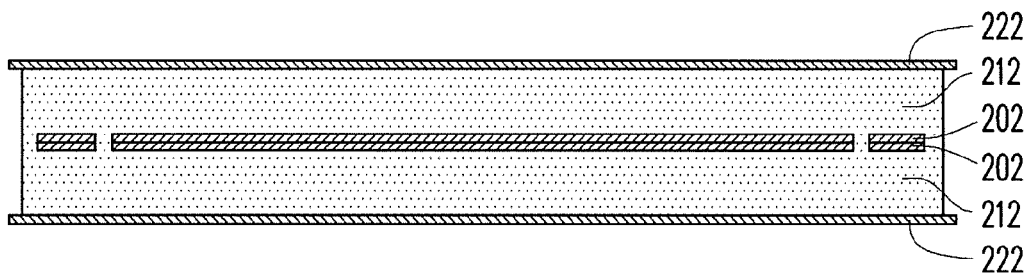
Figure 2D:
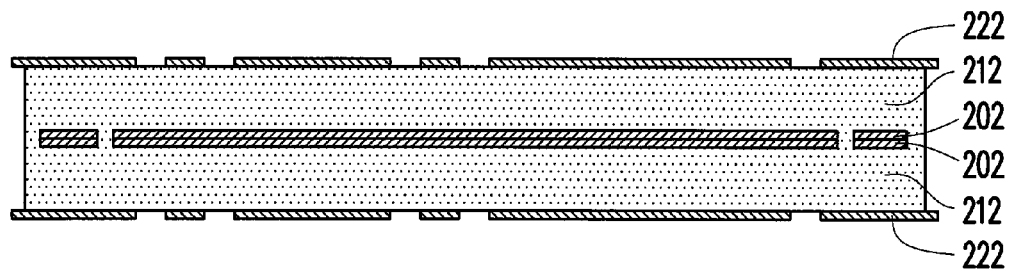
Figure 2E:
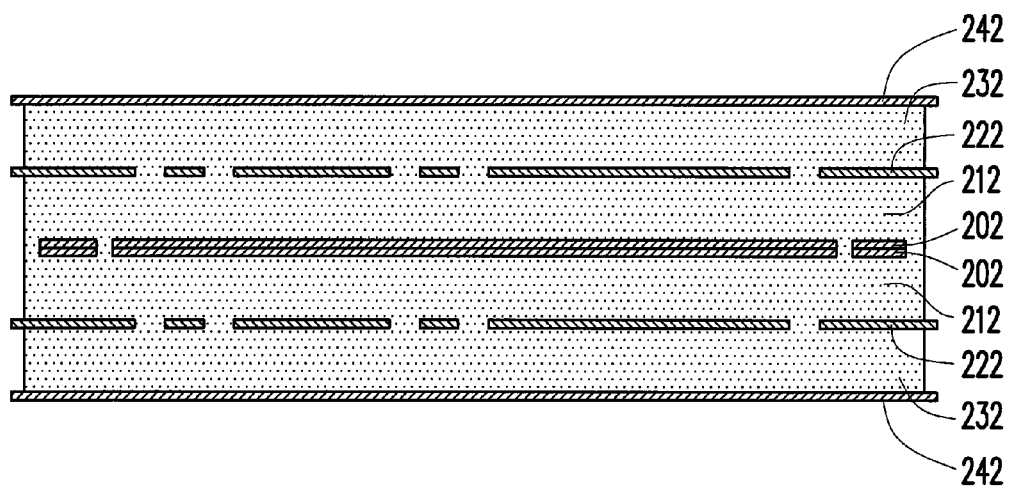

Referring to FIG. 2A and FIG. 2B, two metal layers 202, such as copper foils or other metal foils, are provided and peripheries of the two metal layers 202 are bonded to form a sealed area 204. The method for bonding the peripheries of the two metal layers 202 includes an electric welding process or a spot welding process so that the two metal layers 202 are temporally bonded together to prevent the solutions used in the subsequent process from permeating the space between the two metal layers 202. Certainly, in addition to the electric welding process or the spot welding process, an adhesion or other gel can be used to temporally bond the peripheries of the two metal layers 202 together. In the present embodiment, after bonding the peripheries of the two metal layers 202, at least a through hole H passing through the sealed area 204 can further be formed. The method for forming the through hole H includes a laser ablating process or a mechanical drilling process. Next, referring to FIG. 2C to FIG. 2E, two insulating layers 212 are formed on the two metal layers 202 and two inner conductive layers 222 are formed on the two insulating layers 212. When the two metal layers 202 are still sealed with each other, the inner conductive layers 222 are patterned. Next, another two insulating layers 232 are formed on the two patterned inner conductive layers 222 and two outer conductive layers 242 are formed on the two insulating layers 232. In FIG. 2C, the insulating layers 212 and the inner conductive layers 222, 232 are laminated and the two metal layers 202 bonded with each other are embedded in the insulating layers 212. In addition, in FIG. 2E, the insulating layers 232 and the outer conductive layers 242 are laminated and the inner conductive layers 222 are embedded in the insulating layers 232. In the meantime, the insulating layers 212 are further filled in the through holes H in the sealed area 204 during laminating the insulating layers 212. The sizes of the insulating layers 212 are larger than the sizes of the two metal layers 202 so that the two metal layers 202 are completely encapsulated in the insulating layers 212 so as to prevent from the contamination of ambient impurities or solution.

Figure 2F:
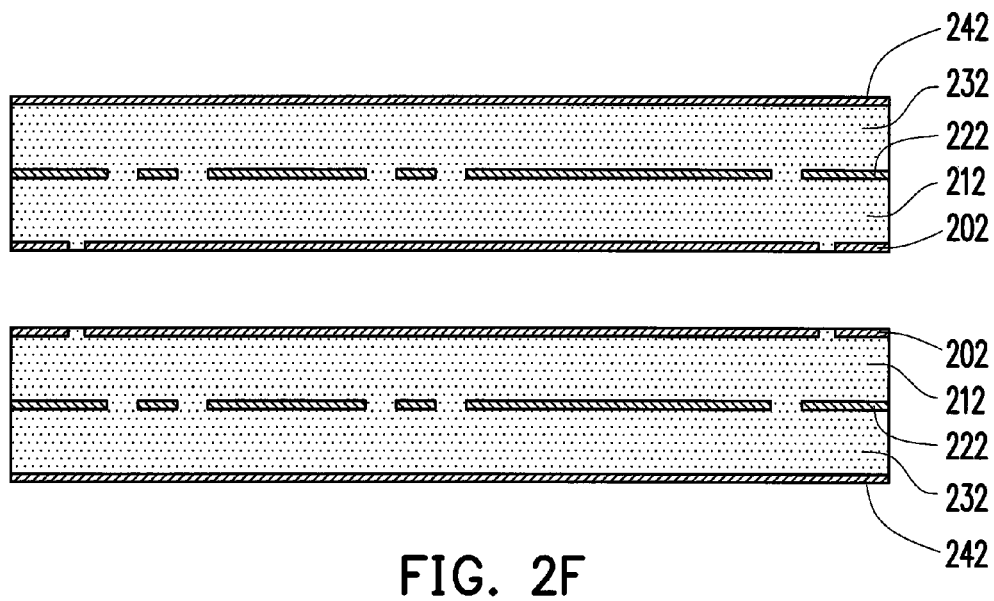

Next, referring to FIG. 2F, the sealed area 204 of the two metal layers 202 are separated to form two separated circuit substrates 200. The two circuit substrates 200 respectively have three circuit layers. In the present embodiment, a separator machine or other tools can be used for removing a region of the sealed area 204 encapsulating the two metal layers 202 by taking the through hole H as a reference so as to completely separate the two metal layers 202. Certainly, the method for separating the two metal layers 202 is not restricted in the aforesaid process.

Figure 2G:
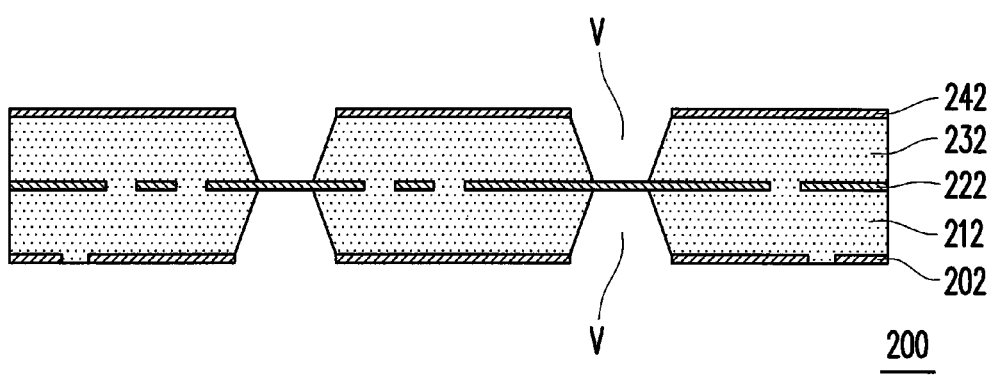
Figure 2H:
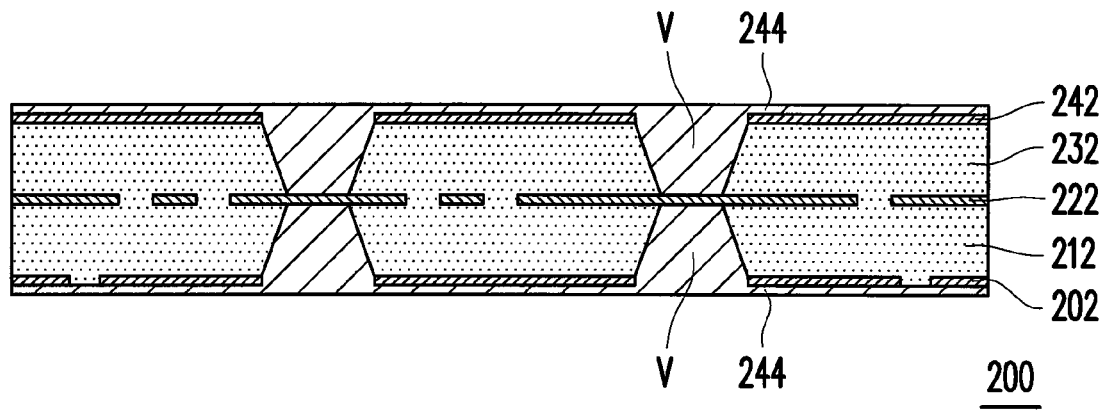
Figure 2I:
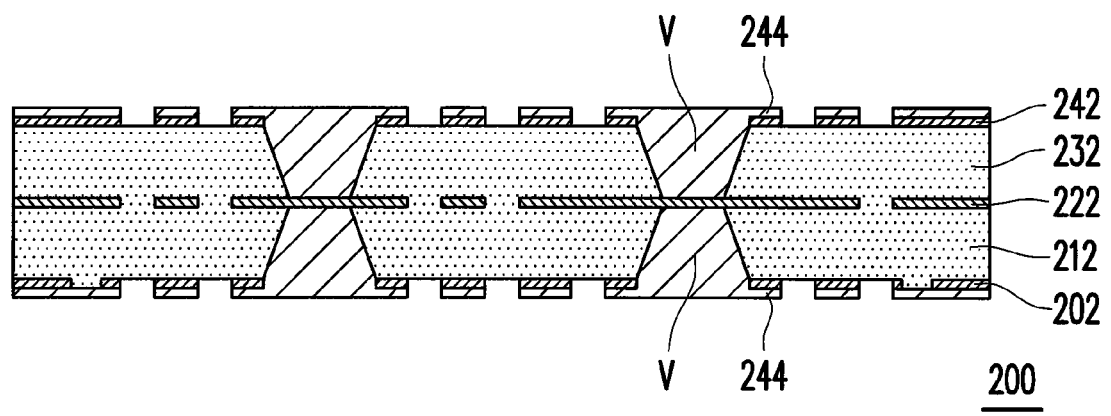

Next, FIG. 2G and FIG. 2H which illustrated show only one circuit substrate 200 are referred. A part of the insulating layers 212, 232, a part of the metal layer 202, and a part of the outer conductive layer 242 are removed to form a plurality of blind holes V exposing the inner conductive layer 222. The method for forming the blind holes V includes a laser ablating process. Thereafter, a conductive material 244 is formed in the blind holes V and on remained portions of the metal layer 202 and the outer conductive layer 242. The method for forming the conductive material 244 includes an electroplating process and the conductive material 244 can exemplified as copper or other metal. Then, referring to FIG. 2I, the conductive material 244, the metal layer 202 and the outer conductive layer 242 are patterned to form the required circuit layout of each circuit substrate 200.

The circuit substrate 200 having three circuit layers as shown in FIG. 2G includes a metal layer 202, an outer conductive layer 242, an inner conductive layer 222, and two insulating layers 212 and 232. The inner conductive layer 222 is located between the metal layer 202 and the outer conductive layer 242. The two insulating layers 212 and 232 are respectively located between the metal layer 202 and the inner conductive layer 222 and between the outer conductive layer 242 and the inner conductive layer 222. In addition, the circuit substrate 200 having three circuit layers as shown in FIG. 2H further includes a conductive material 244 located in a plurality of blind holes V passing through the insulating layers 212 and 232, and the conductive material 244 is electrically connected between the metal layer 202 and the inner conductive layer 222 and between the outer conductive layer 242 and the inner conductive layer 222.

According to the above description, either odd circuit layers or even circuit layers can be formed by the aforesaid method for manufacturing a circuit substrate which is capable of forming two circuit substrates simultaneously to shorten the time consumption for manufacturing the multi-layer circuit substrate and is capable of preventing from the problem of the warped circuit substrate to enhance the reliability.

In summary, the peripheries of two metal layers are firstly bonded to form a sealed area in the invention. The two metal layers are separated until the double-sided insulating layers and the double sided conductive layer are laminated. Accordingly, the problem of warped circuit substrate is not easily generated after the laminating process of the double-sided insulating layers and the double sided conductive layer so that the reliability of the circuit substrate is enhanced and the time of the manufacture of the circuit substrate is effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a circuit substrate, comprising:
    bonding peripheries of two metal layers directly to form a sealed area;
    forming at least a through hole passing through the sealed area, and wherein an area of the through hole is smaller than an area of the sealed area;
    forming two insulating layers on the two metal layers, wherein an area of each of the two insulating layers is larger than an area of each of the two metal layers;
    forming two conductive layers on the two insulating layers;
    laminating the two insulating layers and the two conductive layers and the two metal layers bonded with each other being embedded between the two insulating layers, wherein portions of the two insulating layers fill in the through hole when the two insulating layers are laminated;
    removing a part of the two insulating layers and a part of the two conductive layers to form a plurality of blind holes exposing the two metal layers;
    forming a conductive material in the blind holes and on remaining portions of the two conductive layer; and
    removing the bonded peripheries of the two metal layers to form two separated circuit substrates.

2. The method for manufacturing a circuit substrate of claim 1, wherein the method for bonding the peripheries of the two metal layers comprises an electric welding process or a spot-welding process.

3. The method for manufacturing a circuit substrate of claim 1, wherein the method for forming the conductive material comprises an electroplating process.

4. The method for manufacturing a circuit substrate of claim 1, wherein after removing the bonded peripheries of the two metal layers, the method further comprises patterning the conductive material and the two conductive layers.

* * * * *